March 20, 1962 R. L. HARTWELL 3,026,367

SHIELDING AND MOUNTING STRIP

Filed May 8, 1959

INVENTOR.
RALF L. HARTWELL

BY

Pollard, Johnston, Smythe & Robertson
ATTORNEYS

United States Patent Office 3,026,367

Patented Mar. 20, 1962

3,026,367

SHIELDING AND MOUNTING STRIP

Ralf L. Hartwell, Cranford, N.J., assignor to Technical Wire Products Inc., Springfield, N.J., a corporation of New Jersey Filed May 8, 1959, Ser. No. 811,967

7 Claims. (Cl. 174—35)

This invention relates to an electrical shielding arrangement for openings formed between surfaces.

The operation of any electrical equipment may cause radio interference. Radio interference has been defined as the undesired conducted or radiated electrical disturbances, including transients, which may interfere with the operation of electrical or electronic communication equipment or other electronic equipment. In an ever-growing number of areas of activity, the reduction and elimination of radio interference has become a critical necessity. Today's aircraft carry extensive arrays of electrical equipment such as communication, navigation, instrumentation and flight controls systems which operate over a broad region of the electro-magnetic spectrum. With the close proximity of components and the frequent use of high power, it is essential that one system be prevented from interfering with the others. Obviously, in such an environment, radio interference inducing false signals in a nearby system could cause fatal results. In military equipment, the use of extremely high power in the microwave region may be the source of severe interference. Much of military receiving equipment designed to operate with very low signal strength levels can be made inoperative by radio interference.

Radio interference may be conducted into or out of a piece of electrical equipment by means of the leads which connect the equipment to a power supply, signal source, or another unit of electrical equipment. Electrical filters are normally used to block conducted radio interference. Radio interference may also be radiated into or out of electrical equipment. The general preventive measure for radiated radio interference is to shield the electrical equipment by enclosing it in a container of conductive material.

It is generally impractical to enclose electrical equipment in a conductive container having no openings or seams. Normally, the container or housing of electrical equipment must be provided with openings for access to the interior so that service and maintenance may be performed. Other openings may be needed for electrical connections, cooling devices, and other design considerations. Merely covering the openings with lids or doors may not insure adequate shielding because such covering results in a number of seams between themselves and the container or housing. The result is that these seams may present long narrow slot openings into the housing. Normal manufacturing techniques, weight considerations, and structural deflections make it inevitable that narrow slot openings will be present at these seams. Such narrow slot openings may result in excessive leakage of radiated radio interference. It is known that a narrow slot at a given frequency will permit more leakage than a small hole having a greater area since the leakage at a given frequency is proportional to the length of the opening, not to its area.

In one embodiment, the subject electrical shield serves to shield radiated radio interference at openings between surfaces such as the narrow slot openings which may be present at the covering of openings into the housing of the electrical equipment. The electrical shield employs a strip member having a slot extending along its length. The resilient conductive shielding member has a bar-like form with a fin extending along its length. The fin is disposed and held within the slot in the strip member.

The thickness of the shielding member is greater than that of the strip member so that when the surfaces are placed in contact with the strip member the resilient shielding member is compressed between them and serves to shield the opening between the surfaces.

Since the surfaces are in contact with the strip member, the strip member furnishes a solid support between them. The greater thickness of the conductive resilient shielding member as compared to the strip member, insures that the shielding member is compressed between the two surfaces when they are positioned against the strip member. In this way, a good electrical contact is made between the shielding member and the surfaces. The thickness of the shielding member can be readily selected so that it will be deformed only within its elastic range and therefore may be used repeatedly.

In another embodiment, the strip member may be provided with slots at opposite sides. The electrical shielding member is held within one slot while a fluid sealing member is held within the other. When the surfaces are placed in contact with the strip member, both the shielding and sealing members, due to their greater thicknesses, are compressed between the surfaces so as to function effectively.

These and other objects, advantages and features of the invention will become apparent from the following description and drawings.

*Description*

Figures 1, 2, 3, 4, 5, 6, 7:
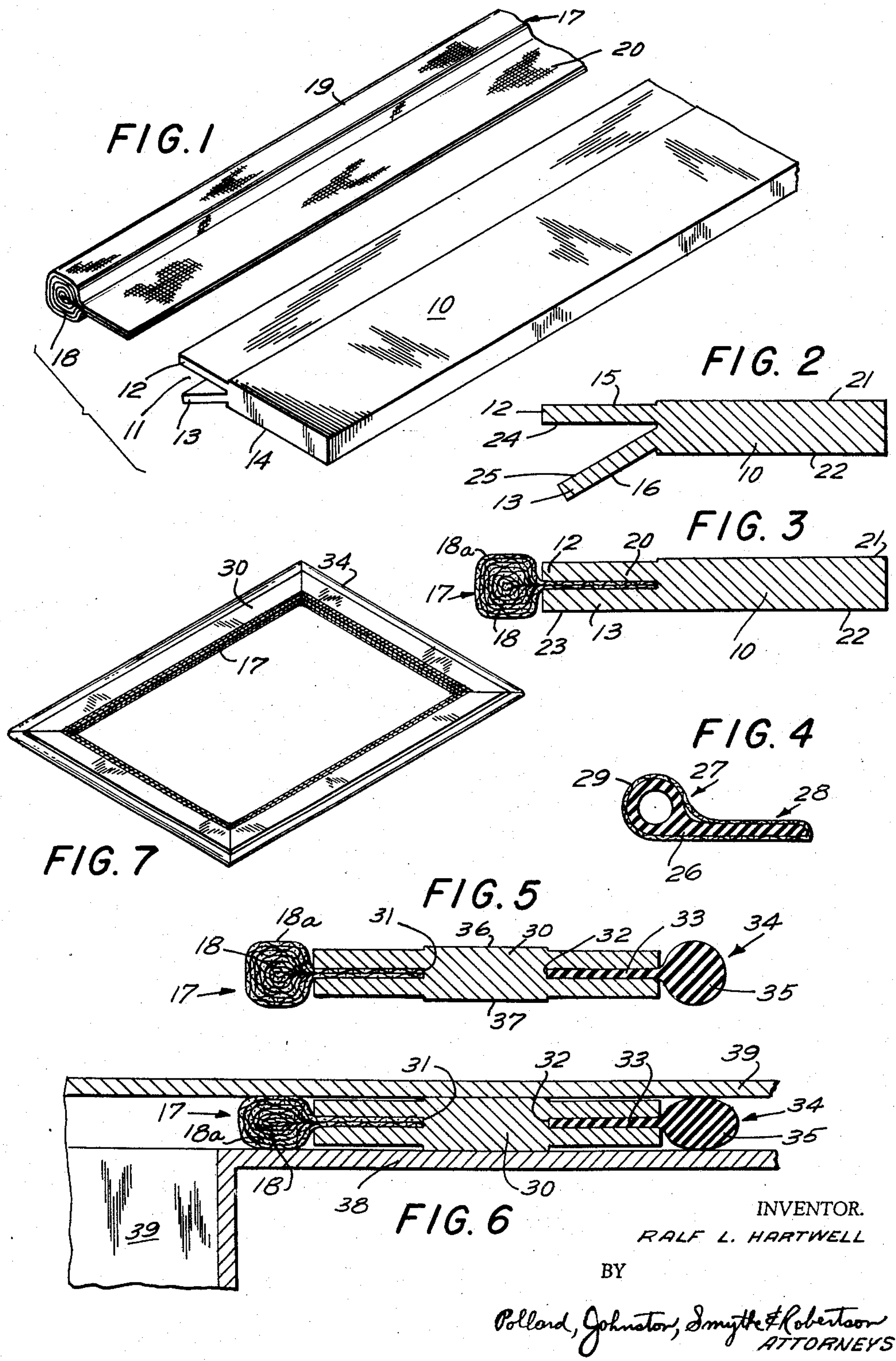
FIG. 1 is a perspective view of the shielding and strip members before assembly.
FIG. 2 is an enlarged sectional view of the strip member before assembly.
FIG. 3 is an enlarged sectional view of the electrical shield.
FIG. 4 is an enlarged sectional view of a modified form of the shielding member.
FIG. 5 is an enlarged sectional view of the combined electrical shielding and fluid sealing members.
FIG. 6 is an enlarged sectional view of the combined electrical shielding and fluid sealing members installed beneath the cover of a housing.
FIG. 7 is a perspective view of the combined electrical shielding and fluid sealing members as used with a rectangular opening.

Strip 10 (FIG. 1) is provided with slot 11 and flanges 12 and 13. Flange 13 may be formed at an angle to side 14 of strip 10. Flanges 12 and 13 may have relieved surfaces 15 and 16 (FIG. 2). Strip 10 may be extruded or formed by conventional mill techniques in order to provide slot 11 with inclined flange 13.

Shielding member 17 (FIG. 1) includes core 18 which may be fabricated by rolling a flattened knitted tube, knitted in a conventional manner from a conductive filament such as fine gauge metal wire. The flattened knitted tube is rolled in a manner such that its axis of rotation is parallel to the longitudinal axis of the tube. Core 18 may be subsequently incased by an additional tube 18*a*, also knitted from a conductive filament. Tube 18*a* impedes the rolled tube from unwinding and serves to hold the outer end of the rolled tube in place. The net result of these operations is that core 18, formed from a rolled flattened tube of knitted material, is surrounded by an additional tube 18*a* of knitted material. By calendering operations, core 18 incased by tube 18*a*, is formed into shielding member 17 having bulb section 19 and a fin section 20. Bulb section 19 may have various cross-sections such as circular, rectangular, or substantially square ones. Fin section 20 is formed by compressing and deforming core 18 and tube 18*a* in order to obtain a predetermined density. The steps of initially knitting a tube, flattening and rolling it to form core 18, and subsequently incasing core 18 in an additional tube 18a, gives shielding member 17 excellent resilient characteristics. The rolled construction contributes to the general uniformity of resiliency and density in the core material of bulb section 19 and fin section 20. After forming bulb section 19, the material substantially retains its uniform resiliency and density.

In assembling the electrical shield, fin section 20 is inserted into slot 11 and flanges 12 and 13 are pressed against the fin section. The relieved sections 15 and 16 facilitate the forming operation and insure that the thickness or distance betwen sides 21 and 22 of strip 10 is greater than the distance across relief surfaces 15 and 16. As an alternate method (FIG. 3) flange 13 may be formed without relief so that its outer surface 23 is an extension of the surface of side 22 of strip 10. In this case, after the forming operation, only flange 12 will have a surface below that of side 21 of strip 10. After flanges 12 and 13 have been formed, they exert compressive force upon fin section 20 so as to secure it within slot 11. If strip 10 is fabricated from material having a hardness less than the filament used in producing the material for shielding member 17, the filament can indent the inner surfaces 24 and 25 of flanges 12 and 13, respectively, so as to enhance the gripping of fin section 20.

In another embodiment, the shielding member may include core 26 (FIG. 4) of resilient material such as plastic or rubber. Core 26 is molded so as to have hollow bulb section 27 and fin section 28. Tube 29, knitted from conductive filaments, incases core 26. To form the electrical shield, fin section 28 is installed in slot 11 of strip 10 and flanges 12 and 13 are formed against the fin section to secure the shielding member in place.

The dimensions of shielding member 17 initially are determined so that the resulting bulb section will have a thickness greater than that of strip 10. In use, the electrical shield (FIG. 3) including shielding member 17 and strip 10, may be installed along the upper edge or flange of a housing (not shown) containing electrical equipment. The electrical shield may be attached to the top surface of the housing walls by conventional means with shielding member 17 disposed along the inner or outer edge of the container wall. Upon installation of the housing cover, the cover surface will first contact shielding member 17. As the cover is drawn into position by conventional means such bolts, cap screws, or dogs, it will compress and deflect shielding member 17 until the cover surface comes into contact with and bears upon strip 10. Thus, the installed cover is rigidly supported by bearing on strip 10 which is supported by the housing walls. At the same time the opening between the housing cover and walls, as well as the junction of contacting surfaces of the housing cover and strip 10 are electrically shielded by shielding member 17. The thickness of strip 10 and the thickness of shielding member 17 are of a predetermined ratio so that the deflection of shielding member 17 during installation of the cover is within the elastic range of shielding member 17. By not exceeding the elastic range of shielding member 17, the knitted wire material will not receive a permanent set or deformation. With this condition, shielding member 17 is tightly compressed between the container cover and wall so that the filaments of the shielding member form a low resistance electrical contact with the adjacent surfaces. Upon subsequent removal of the cover, shielding member 17 will substantially regain its initial cross section and thus be ready to serve as an effective electrical shield upon reinstallation of the cover. For the case where the electrical shield is formed with core 26 and tube 29, the filaments of tube 29 contact the adjacent surfaces of the housing cover and wall and shield the opening. The resiliency of core 29 insures a tight fit along the electrical shield.

Another embodiment of the electrical shield is shown in FIG. 5. Strip 30 is provided with slots 31 and 32 extending along its edges. The fin section 20 of shielding member 17 is inserted in slot 31 and fin section 33 extending along the length of sealing member 34 is inserted in slot 32. The flanges of strip 30 adjacent to slots 31 and 32 are formed to compress fin sections 20 and 33 respectively. Sealing member 34 may be of resilient material such as plastic or rubber and is provided with a bulb portion 35 extending along its length. The outer sides of the flanges of strip 30 may be initially relieved during fabrication of the strip or may be deformed as they are forced against fin sections 20 and 33 with the result that the distance between sides 36 and 37 of strip 30 is greater than that between the outer sides of the flanges.

As shown in FIG. 6, the electrical shield and seal may be installed on the upper side of flange 38 of housing 39, with sealing member 34 adjacent to the outside edge of flange 38. Strip 30 may be attached to flange 38 by conventional methods. Cover 39 is placed over the housing and is drawn down toward flange 38 by conventional attachment devices. As cover 39 is drawn toward flange 38 its lower surface bears on shielding member 17 and sealing member 34. These members are deformed until cover 39 rests on side 36 of strip 30. The thickness of strip 30 between sides 36 and 37 is selected so as to prevent the installed cover 39 from deforming shielding member 17 beyond its elastic range. At the same time, sealing member 34 is compressed to form a fluid tight seal between flange 38 and cover 39.

As shown in FIG. 7 the shielding device may be fabricated into predetermined forms for a housing having a rectangular opening. The shielding device may initially be provided with shielding member 17 installed in slot 31. After forming the flanges against fin section 20, strip 30 is cut to provide four mitered joints. After arranging strip 30 into a rectangular form, fin section 33 of sealing member 34 is placed in slot 32 and the flanges are formed to secure it in place. As determined by individual applications, sealing member 34 and shielding member 17 may be arranged at either the inner or outer edge of cover 39. To form a double shield, shielding member 17 may be placed in both of slots 31 and 32 of strip 30.

The terms and expressions which I have employed are used in a descriptive and not in a limiting sense and I have no intention of excluding such equivalents of the invention described, or of portions thereof, as fall within the scope of the claims.

What is claimed is:

1. An electrical shield for an opening between surfaces including a rigid base member having oppositely disposed face portions spaced apart at a distance corresponding to the thickness of said base member, edge portions extending along the outside of said base member between said face portions, and a slot extending along the length of the outside of at least one of said edge portions between said face portions, and a resilient electrically conductive shielding member having a body portion and a fin portion, said fin portion being disposed within said slot and being held by the sides of said slot, said body portion extending outwardly from said slot and having a thickness in a direction substantially parallel to and greater than the thickness of said base member, so that said surfaces will deform said body portion when contacting said face portions of said base member.

2. An electrical shield for an opening between surfaces in accordance with claim 1 in which said resilient electrically conductive shielding member includes a roll of material fabricated from electrically conductive filaments, the axis of said roll being substantially parallel to the longitudinal axis of said shielding member, said roll being deformed to provide said body portion having a predetermined transverse cross-section and said fin portion.

3. An electrical shield for an opening between surfaces in accordance with claim 1 in which said resilient electrically conductive shielding member includes a roll of material knitted from electrically conductive filaments, the axis of said roll being substantially parallel to the longitudinal axis of said shielding member, and a sleeve knitted from electrically conductive filaments incasing said roll, and said roll and said sleeve together being deformed to provide said body portion having a predetermined transverse cross-section and said fin portion.

4. An electrical shield for an opening between surfaces in accordance with claim 1 in which at least one of the face portions adjacent said slot are relieved to provide a clearance with the adjacent one of said surfaces when said surfaces are in said operative position.

5. An electrical shield for an opening between surfaces in accordance with claim 1 in which said resilient electrically conductive shielding member includes a roll of knitted material formed from a flattened tube of knitted conductive filaments the axis of said roll being substantially parallel to the longitudinal axis of said shielding member, said roll being deformed to provide said body portion having a predetermined transverse cross-section and said fin portion.

6. An electrical shield for an opening between surfaces including a rigid base member having oppositely disposed face portions spaced apart at a distance corresponding to the thickness of said base member, edge portions extending along the outside of said base member between said face portions, and a slot extending along the length of the outside of at least one of said edge portions between said face portions, and a resilient electrically conductive shielding member having a body portion and a fin portion formed from a roll of material of knitted electrically conductive filaments, said fin portion having a greater density than said body portion and being disposed within said slot, the sides of said slot being deformed to hold said fin portion in said slot, said body portion extending outwardly from said slot and having a thickness in a direction substantially parallel to and greater than the thickness of said base member, so that said surfaces will deform said body member when contacting said face portions of said base member.

7. A closure device for an opening between surfaces including a rigid base member having oppositely disposed face portions spaced apart at a distance corresponding to the thickness of said base member, edge portions extending along the outside of said base member between said face portions, and slots extending along the length of the outside of said edge portions between said face portions, a resilient electrically conductive shielding member having a body portion and a fin portion, and a resilient sealing member having a body portion and a fin portion, each of said fin portions being disposed within a different one of said slots and held by the sides of said slots, said body portions extending outwardly from said slots and having a thickness in a direction substantially parallel to and greater than the thickness of said base member, so that said surfaces will deform said body members before contacting said face portions of said base members.

References Cited in the file of this patent

UNITED STATES PATENTS

| | | |
|---|---|---|
| 695,174 | Roller | Mar. 11, 1902 |
| 2,727,084 | Schreiber | Dec. 13, 1955 |
| 2,974,183 | Kes et al. | Mar. 7, 1961 |

FOREIGN PATENTS

| | | |
|---|---|---|
| 958,482 | Germany | Feb. 21, 1957 |

OTHER REFERENCES

Publication I, "Suppressing Radio Interference With Metex Shielding Products" published by Metal Textile Corporation, Electronics Division, Roselle, N.J., copyright 1957.

Publication II, "Suppressing Radio Interference With Metex Electronic Weatherstrip and RF Gaskets," published by Metal Textile Corporation, Electronics Division, Roselle, N.J.

UNITED STATES PATENT OFFICE
CERTIFICATE OF CORRECTION

Patent No. 3,026,367 March 20, 1962

Ralf L. Hartwell

It is hereby certified that error appears in the above numbered patent requiring correction and that the said Letters Patent should read as corrected below.

Column 3, line 13, for "betwen" read -- between --; line 49, after "such" insert -- as --; column 4, line 1, for "29" read -- 26 --; line 46, "The terms and expressions" should appear as the beginning of a new paragraph.

Signed and sealed this 24th day of July 1962.

(SEAL)
Attest:

ERNEST W. SWIDER
Attesting Officer

DAVID L. LADD
Commissioner of Patents